US008368497B2

(12) United States Patent
Pal et al.

(10) Patent No.: US 8,368,497 B2
(45) Date of Patent: Feb. 5, 2013

(54) TRANSFORMER ASSEMBLY WITH ENHANCED AIR COOLING

(75) Inventors: Debabrata Pal, Hoffman Estates, IL (US); Mark W. Metzler, Davis, IL (US); Frank Z. Feng, Loves Park, IL (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 21 days.

(21) Appl. No.: 13/050,509

(22) Filed: Mar. 17, 2011

(65) Prior Publication Data
US 2012/0234520 A1    Sep. 20, 2012

(51) Int. Cl.
*H01F 27/08* (2006.01)
*H01F 27/02* (2006.01)
(52) U.S. Cl. .......................... 336/60; 336/59
(58) Field of Classification Search .......... 336/55, 336/57, 59, 60, 65, 90, 92, 221
See application file for complete search history.

(56) References Cited

U.S. PATENT DOCUMENTS

| | | | |
|---|---|---|---|
| 6,882,068 B2 * | 4/2005 | Weeber et al. | 310/59 |
| 6,909,211 B2 * | 6/2005 | Ciciliani et al. | 310/58 |
| 7,265,973 B2 * | 9/2007 | Lanni | 361/695 |
| 7,345,561 B2 * | 3/2008 | Meyer et al. | 336/61 |
| 7,355,851 B2 * | 4/2008 | Lanni | 361/695 |
| 7,567,160 B2 * | 7/2009 | Folts et al. | 336/55 |
| 7,573,362 B2 * | 8/2009 | Thiel et al. | 336/178 |
| 7,714,686 B2 * | 5/2010 | Meyer et al. | 336/61 |
| 7,760,060 B2 * | 7/2010 | Kiuchi et al. | 336/58 |
| 7,819,641 B2 * | 10/2010 | Decker et al. | 417/370 |
| 7,898,128 B2 * | 3/2011 | Hattori et al. | 310/61 |
| 2011/0215890 A1 * | 9/2011 | Abolhassani et al. | 336/60 |

FOREIGN PATENT DOCUMENTS

JP    2005166777 A  *  6/2005

* cited by examiner

*Primary Examiner* — Mohamad Musleh
*Assistant Examiner* — Joselito Baisa
(74) *Attorney, Agent, or Firm* — Kinney & Lange, P.A.

(57) ABSTRACT

A cooling system for a transformer comprises a fan duct and a housing which together enclose an interior space. A transformer located in the interior space is mounted on the fan duct, and has a plurality of core sections surrounded by windings and separated by gaps. An air channeling structure is located between the transformer and the fan duct. A cooling airflow path extends through the air channeling structure, and between core sections of the transformer.

20 Claims, 7 Drawing Sheets

TRANSFORMER ASSEMBLY WITH ENHANCED AIR COOLING

BACKGROUND

The present invention relates generally to electronics cooling, and more particularly to air cooling for a transformer assembly.

Some electronic components in aircraft, including transformers in motor controllers, are commonly located in housings mounted on fan ducts. Transformers in such settings are conventionally encased in thermally conductive potting material and cooled conductively. Potting is applied by filling a mold containing the transformer with liquid potting material. The potting material sets to provide structural support for the transformer and a conductive thermal interface between the transformer and the nearby fan duct, which is ordinarily cool relative to the transformer. Potting materials include silicone and thermosetting plastics, and add considerable undesirable weight to the transformer assembly. A cooling system which dispenses with the added weight of potting material without sacrificing either cooling capacity or structural support is highly desirable.

SUMMARY

The present invention is directed to a cooling system for a transformer. The cooling system comprises a fan duct containing a fan, and a housing attached to the exterior of the fan duct. The fan duct and the housing together enclose an interior space containing a transformer with a plurality of core sections surrounded by windings and separated by gaps. The transformer is mounted on the fan duct, with an air channeling structure located between the transformer and the fan duct. A cooling airflow path passes through the air channeling structure and between the cores of the transformer.

BRIEF DESCRIPTION OF THE DRAWINGS

FIG. 4 is a cross-sectional view of the fan duct and transformer of FIG. 2a.

DETAILED DESCRIPTION

Figure 1A:
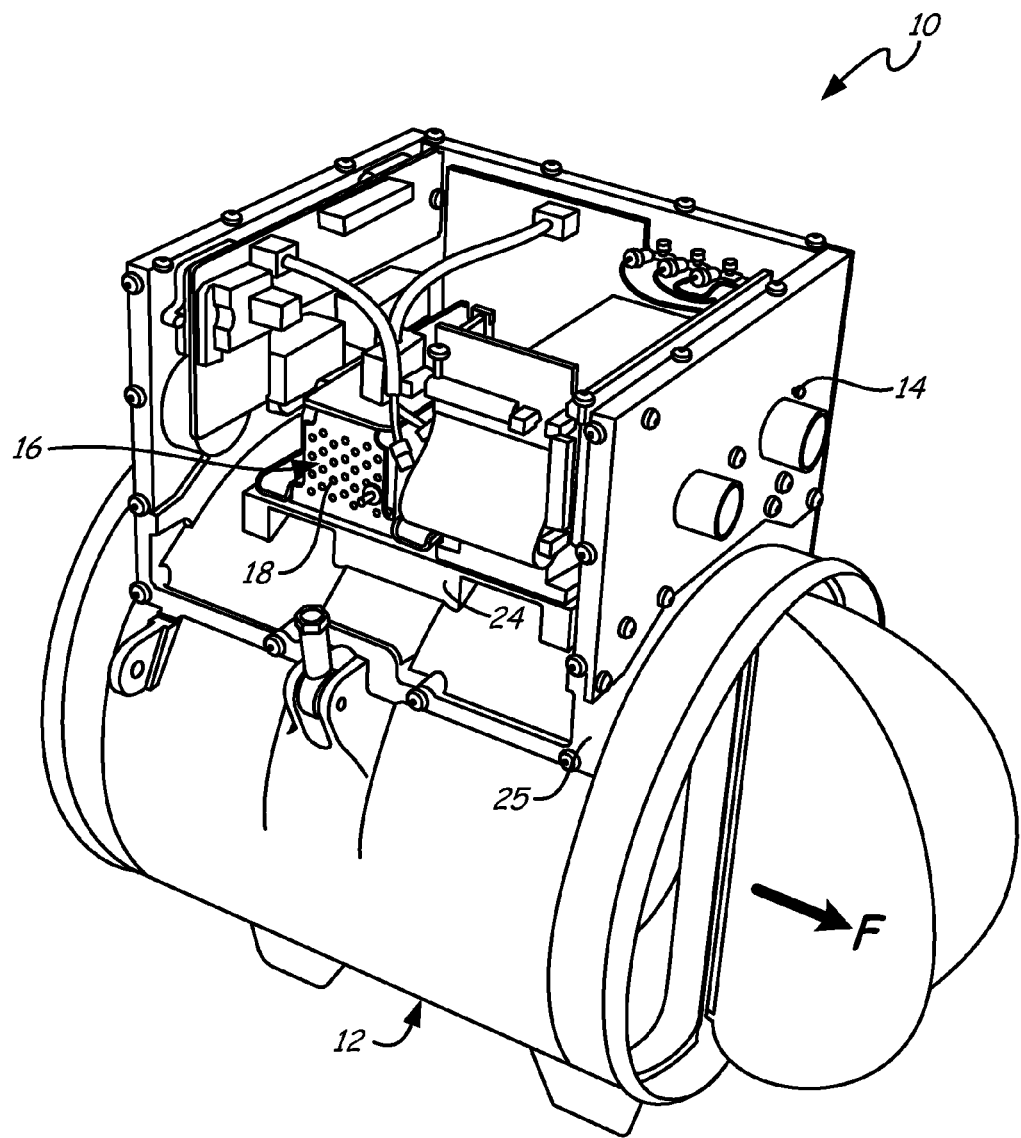
FIG. 1a is a perspective drawing of an electronics housing mounted on a fan duct.

FIG. 1a shows cooling assembly 10, comprising fan duct 12, housing 14, transformer assembly 16, and outer cover 18. Fan duct 12 includes platform 24 and mounting frame 25. Fan duct 12 is a substantially cylindrical duct containing a fan (see FIG. 4) which forces air in airflow direction F, when active. Fan duct 12 may, for example, be an aluminum duct for an aircraft air management system, such as a cabin or lavatory air duct or a cooling air supply. Fan duct 12 and housing 14 together enclose an interior space for electronics.

Housing 14 is a boxlike structure containing electronics including transformer assembly 16. Only three sides of housing 14 are shown in FIG. 1a, but housing 14 will ordinarily form a closed cover bolted to fan duct 12 at mounting frame 25, and entirely enclosing transformer assembly 16. In the depicted embodiment, transformer assembly 16 is mounted on a platform 24, a flat platform formed in the exterior surface of fan duct 12. Housing 14 may be formed of cast or pressed metal, such as aluminum. Transformer assembly 16 includes a transformer (see FIG. 1b) and is surrounded and supported by outer cover 18. As discussed hereinafter, transformer assembly 16 is cooled by an airflow stream.

Figure 1B:
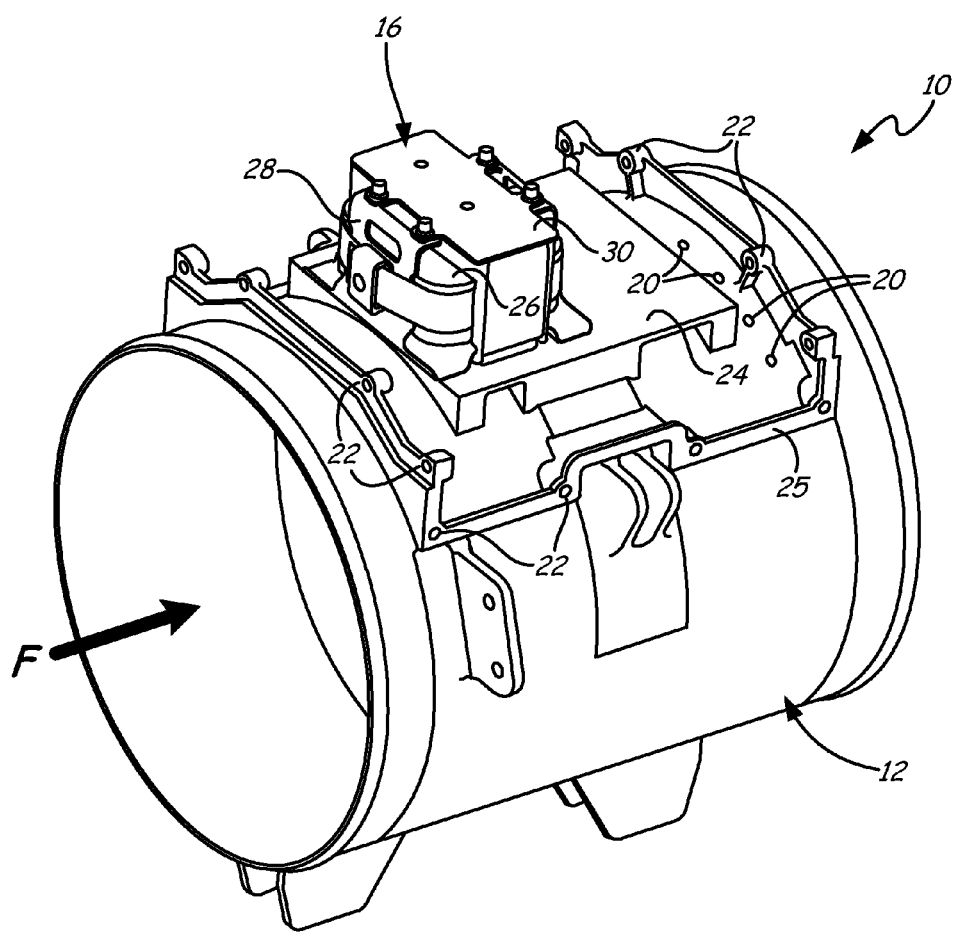
FIG. 1b is a perspective drawing of the fan duct of FIG. 1a with a transformer assembly exposed.

FIG. 1b shows cooling assembly 10, comprising fan duct 12 and transformer assembly 16. Fan duct 12 features air passages 20, platform 24, and mounting frame 25 with housing attachment points 22. Transformer assembly 16 comprises transformer 26, support structure 28, and printed wiring board 30.

FIG. 1b depicts the same structure as FIG. 1a, but with housing 14, outer cover 18, and unlabeled electronics within housing 14 removed to provide an unobstructed view of transformer assembly 16. Housing 14 (see FIG. 1a) attaches to mounting frame 25 of fan duct 12 at attachment points 22, which may be welds or bolt holes. Transformer assembly 16 is mounted on platform 24 of fan duct 12. Although fan duct 12 is substantially cylindrical, platform 24 provides a flat surface for attaching electronics, as depicted.

Transformer 26 is a conventional transformer for power conversion applications, and comprises a ferrous core having a plurality of sections surrounded by windings connected to printed wiring board 30. In one embodiment, transformer 26 is an autotransformer, and includes only one set of windings which serve as both primary and secondary windings. Support structure 28 is formed of two brackets which are bolted or soldered to platform 24, and which anchor both transformer 26 and printed wiring board 30 from opposite sides. Printed wiring board 28 is situated atop transformer 26, and provides electrical contacts for transformer 26. Together with an air channeling structure beneath transformer assembly 16 (see FIGS. 3 and 4), air passages 20 provide an airflow path for cooling air to flow through housing 14 and pass through transformer assembly 16 between cores of transformer 26 (see FIGS. 2b, 4). Air passages 20 are holes in fan duct 12, which provide, in the depicted embodiment, an airflow path between the interior of housing 14 and a high-pressure region of fan duct 12. In this embodiment, air bled from fan duct 12 by air passages 20 enters housing 14 and passes between autotransformer 26 and printed wiring board 30 to cool autotransformer 26. In an alternative embodiment, autotransformer 26 may be situated immediately atop air passages 20 to receive air from below from a high pressure region of the fan. In this embodiment, air passes away from fan duct 12 through autotransformer 26, and out of housing 14 via bleed holes in housing 14. Support structure 28 provides the structural support conventionally supplied by potting material, and air cooling through transformer 26 obviates the need for potting to enhance conductive cooling.

Figure 2A:
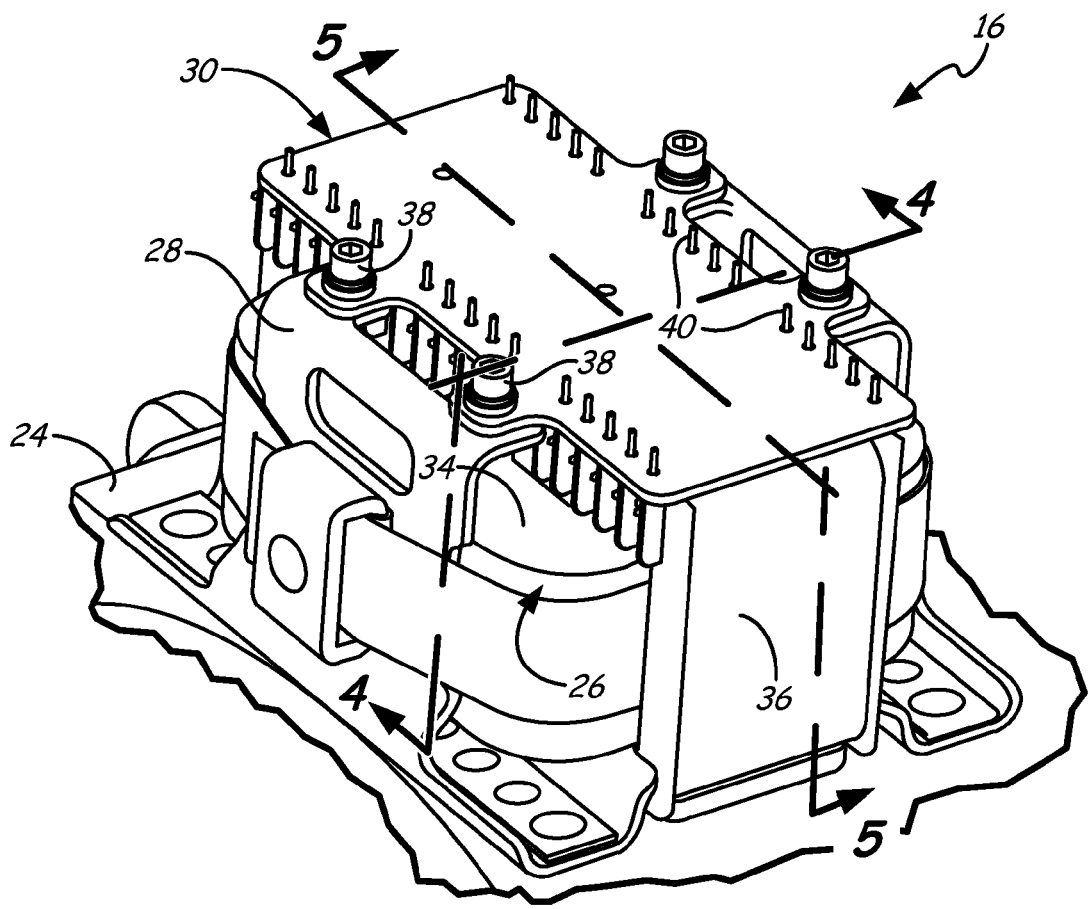
FIG. 2a is a perspective drawing of the transformer of FIG. 1b.

FIG. 2a is an expanded perspective view of transformer assembly 16. Transformer assembly 16 is attached to platform 24, and comprises transformer 26, support structure 28, and printed wiring board 30. Transformer 26 includes core 34 and windings 36. Core 34 is formed of a solid, ferrous material, and has multiple sections, each wrapped in conductive windings 36. In one embodiment, transformer 26 may be a conventional autotransformer with a single winding 36 for each core section. Alternatively, transformer 26 may be a conventional multiple winding transformer, with separate primary and secondary windings 36. Printed wiring board 30 is attached to support structure 28 by fasteners 38, which may be bolts or screws, and to windings 36 by conductive pins 40. Printed wiring board 30 is separated from transformer 26 by an open space through which air may flow (see FIGS. 5a and 5b). Windings 36 have a plurality of turns, and conductive pins 40 form electrical connections between printed wiring board 30 and turns of windings 36.

Figure 2B:
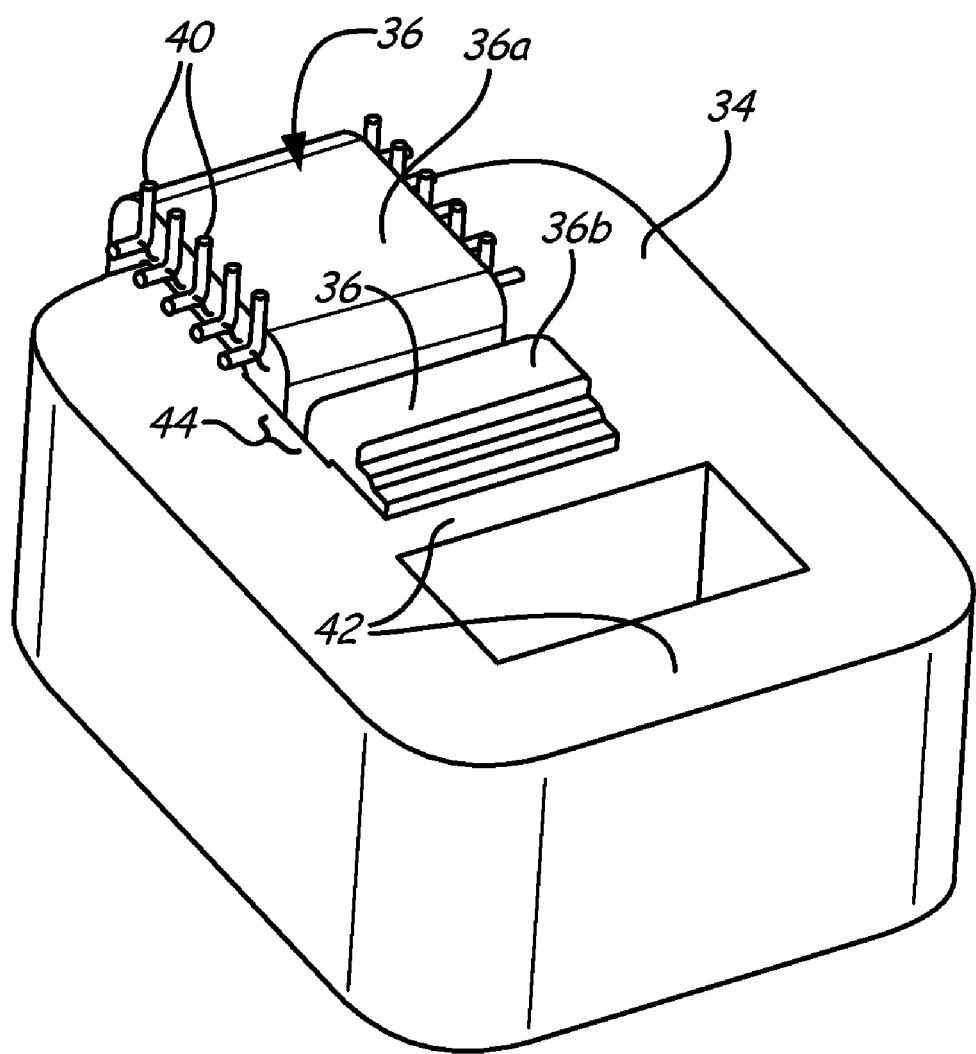
FIG. 2b is a perspective drawing of the transformer of FIG. 2a, with the cores of the transformer exposed.

FIG. 2b is a perspective view of transformer 26 with core 34 and windings 36 exposed. As depicted, core 34 has three flux sections 42 separated by gaps 44. Each flux section 42 is surrounded by one winding 36 with a plurality of turns. The rearmost winding 36a is displayed in its entirety, while the center winding 36b is broken away to expose flux section 42 of core 34. The forwardmost winding 36, which would wrap about the forwardmost flux section 42, is removed altogether so that the shape of core 34 is readily visible.

Pins 40 contact winding 36, forming terminals between turns of winding 36. A voltage across two pins 40 (and across a known number of turns) drives a current through winding 36, producing a magnetic field within flux section 42. By providing a voltage $V_1$ across $N_1$ turns, transformer 26 can draw a voltage $V_2$ across $N_2$ turns, thereby transforming one voltage into another, with $V_1/V_2=N_1/N_2$.

Gaps 44 provide a channel for cooling air to flow between adjacent flux sections 42 of core 34. Cooling air passing between printed wiring board 30 and transformer 26, through gaps 44, and through holes in fan duct 12 (see FIG. 3), carrying heat away from transformer 26.

Figure 3:
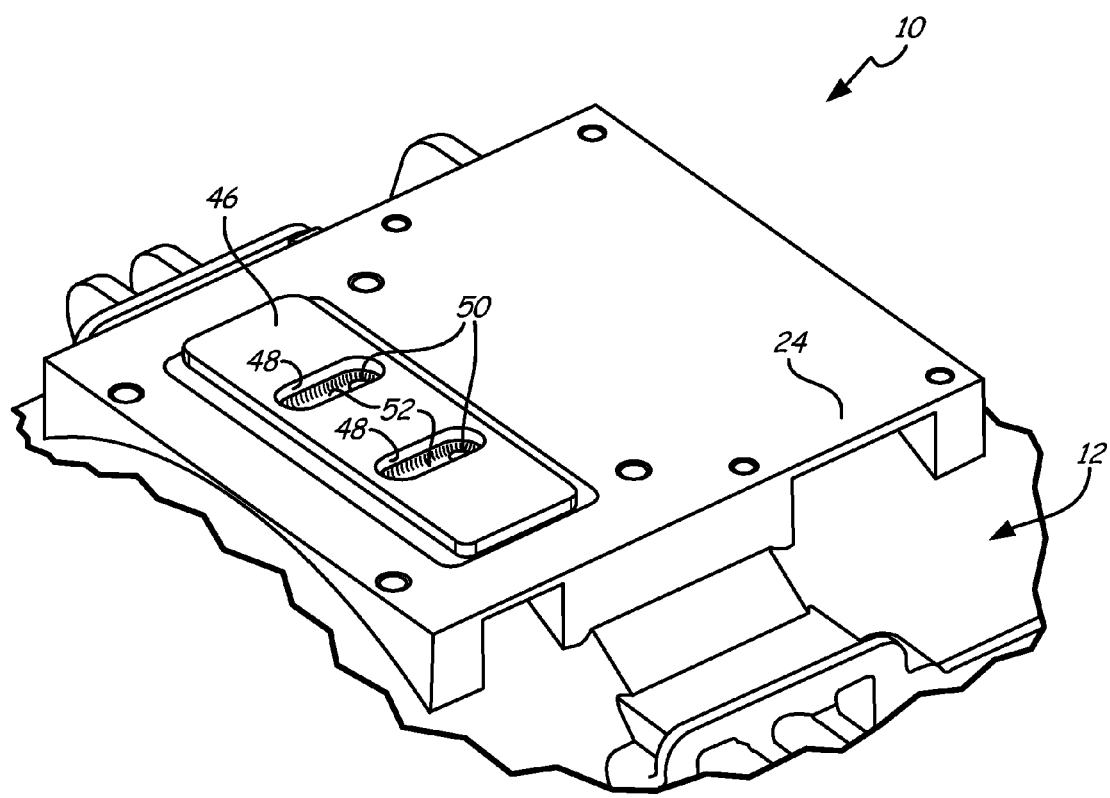
FIG. 3 is a perspective drawing of the fan duct of FIG. 2a, with the transformer removed.

FIG. 3 is a perspective view of parts of cooling assembly 10, including fan duct 12, platform 24, thermal pad 46 with cutouts 48, orifices 50, and channels 52. Thermal pad 46 is a spacer pad with high thermal conductivity, which acts as a thermal interface between transformer 26 (see FIGS. 2a and 2b) and platform 24. Thermal pad 46 has one cutout 48 for each gap 44 in core 34 of transformer 26. Cutouts 48 define paths for cooling air flowing between flux sections 42 of core 34 and through orifices 50, which fluidly connect the interior of fan duct 12 to gaps 44. The airflow paths defined by cutouts 48 may be deepened by channels 52, which are grooves in the surface of platform 24 coinciding with cutouts 48. Cutouts 48, channels 42, and orifices 50 together comprise air channeling structures which guide air, in one embodiment, from a high pressure region of fan duct 12 into gap 44, and in another embodiment, from gap 44 into a low pressure region of fan duct 12.

Figure 4:
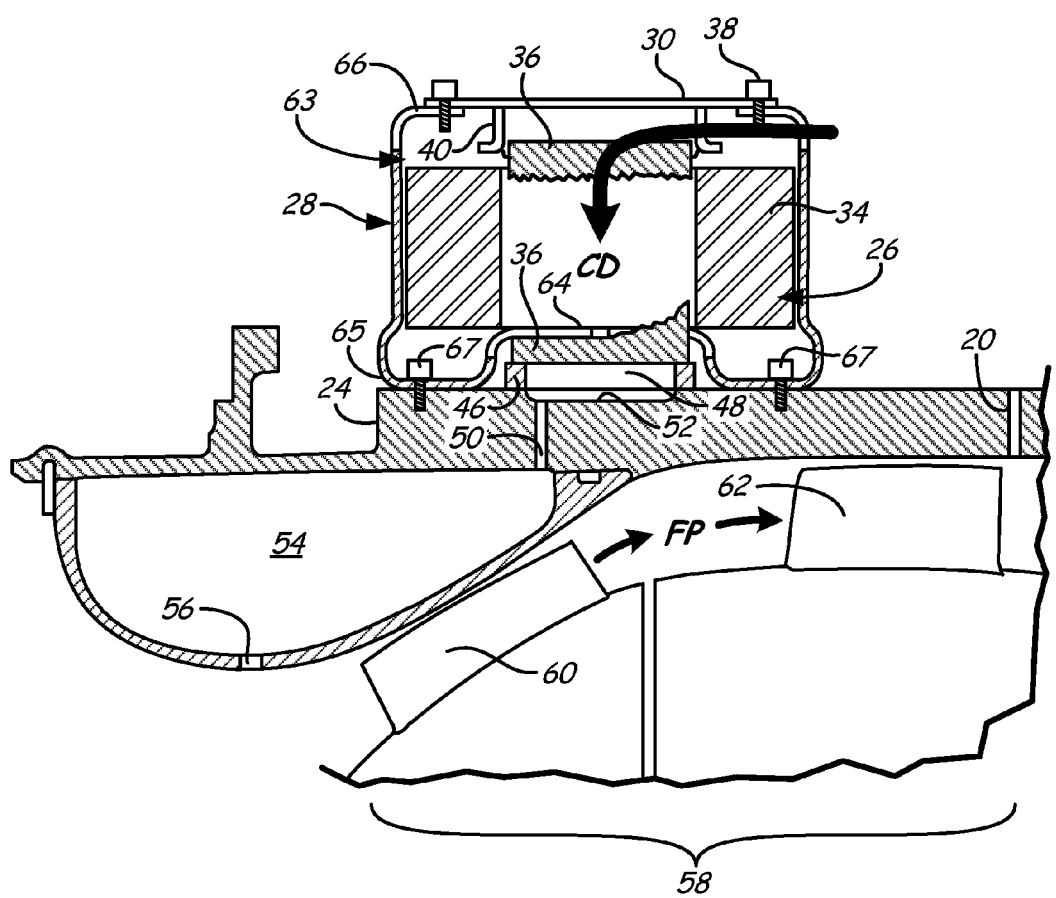

FIG. 4 is a cross-sectional view of cooling assembly 10 taken through line 4-4 of FIG. 2a, with windings 36 broken away to show support structure 28 and core 34. Cooling assembly 10 includes fan duct 12 and transformer assembly 16. Fan duct 12 comprises air passage 20, orifice 50, channel 52, low pressure volute 54, volute outlet 56, and fan 58 comprising rotor 60 and stator 62. Transformer assembly 16 comprises transformer 26 (with core 34 and windings 36), support structure 28 (with brackets 63 having fingers 64, feet 65, and tabs 66), printed wiring board 30, fasteners 38 and 67, and thermal pad 46 (with cutout 48).

Channel 52, cutout 48, and orifice 50 form an air channeling structure which guides air between gaps 44 (see FIG. 3) and through orifice 50. Orifice 50 opens into volute 54, which in turn is fluidly connected main flow path FP of fan 58. Volute 54 is an open space within fan duct 12, kept at low pressure by fan 58. In the depicted embodiment, the pressure differential between volute 54 and air passage 20 draws air from air passages 20 through gap 44 and into volute 54. In alternative embodiments, orifice 50 could open into a high-pressure region of fan duct 12 downstream of rotor 60 (rather than into volute 54), diverting air through gap 44 and housing 14, and expelling air from housing 14 via bleed holes on the side and top walls of housing 14. Fan 58 is depicted as a single stage fan having a single rotor and stator, each with a plurality of blades. Fan 58 may alternatively be a simple fan with only a rotor, or a multistage fan with multiple rotors or stators.

Support structure 28 is made up of two brackets 63, which support core 34 from opposite sides. Each bracket 63 has fingers 64, feet 65, and tabs 66. Tabs 66 are attached to printed wiring board 30 with fasteners 38, and support printed wiring board 30 above transformer 26. Feet 65 are anchored to platform 24 by fasteners 67, which, like fasteners 38, may be bolts or screws. Fingers 64 are elongated tabs which support flux sections 42 of core 34, and extend between core 34 and windings 36 (see FIG. 5b). In the depicted embodiment, air from air passage 20 flows between printed wiring board 30 and transformer 26 and through gap 44 in cooling direction CD, accepting heat from transformer 26 before passing along channel 52 through orifice 50, into main flow path FP of fan duct 12. In an alternative embodiment, air from main flow path F is diverted upward through an alternative orifice 50 located in a high-pressure region of fan duct 12, and flows through channel 52 and gap 44 and out through bleed holes in the walls of housing 14 in a direction opposite cooling direction CD.

Figure 5A:
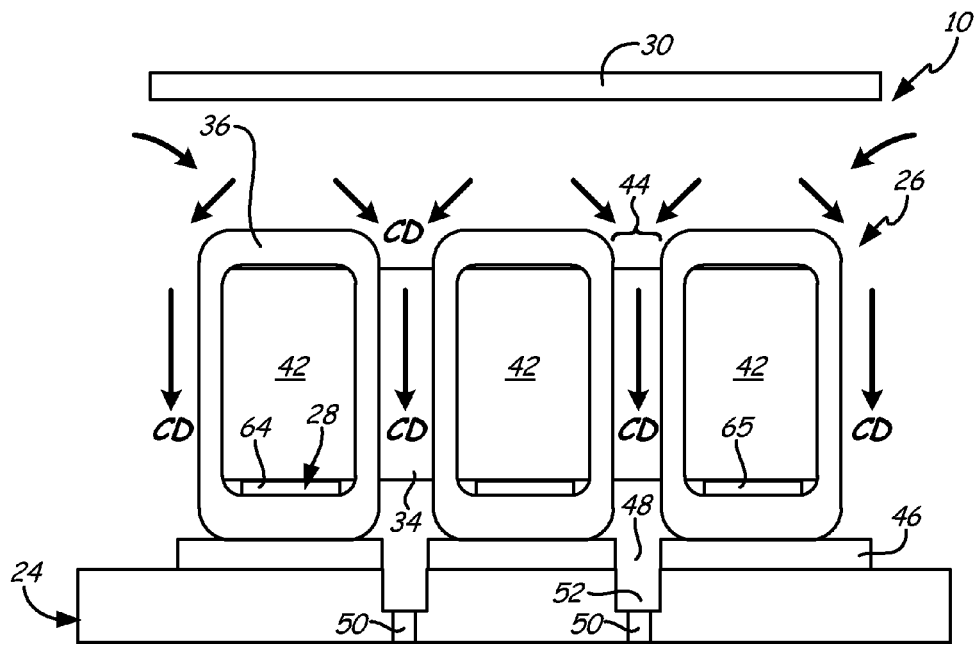
FIG. 5a is a simplified cross-sectional view of the fan duct and transformer of FIG. 4.

FIG. 5a is a simplified cross-sectional view of cooling assembly 10 taken along line 5-5 of FIG. 2a. Cooling assembly 10 comprises platform 24 (with channels 52 and orifices 50) and transformer assembly 16. Transformer assembly 16 includes support structure 28 (with fingers 64), transformer 26 (with core 34 and windings 36 separated by gap 44), printed wiring board 30, and thermal pad 46 (with cutouts 48). As described above, one finger 64 of support structure 28 extends between each flux section 42 and the corresponding winding 36. Fingers 64 support cores 34 and conduct heat away from cores 34 and windings 36.

Transformer 26 is convectively cooled by air flowing through cutout 48 in thermal pad 46, and along channel 52 in fan duct 12. If orifice 50 connects to a low pressure region of fan duct 12, cooling air flows in cooling direction CD through gap 44, cutout 48, channel 52, and orifice 50. If orifice 50 connects to a high pressure region of fan duct 12, cooling air flow in the opposite direction, instead.

Figure 5B:
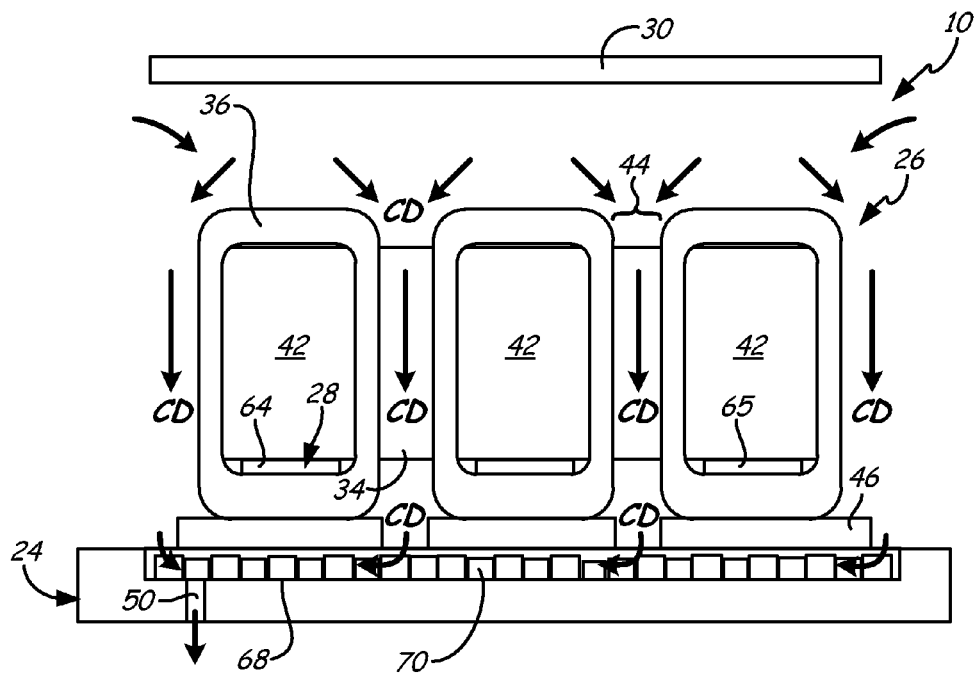
FIG. 5b is a simplified cross-sectional view of an alternative embodiment of the fan duct and transformer of FIG. 4.

FIG. 5b is a simplified cross-sectional view of an alternative embodiment of cooling assembly 10, taken along line 5-5 of FIG. 2a. Cooling assembly 10 comprises fan duct 12 (with recess 68 and orifice 50) and transformer assembly 16. Transformer assembly 16 includes support structure 28 (with fingers 64), transformer 26 (with core 34 and windings 36 separated by gap 44), thermal pad 46 (with cutouts 48), and fin core 70.

As an alternative to channels 48, fan duct 12 may be provided with recess 68 containing fin core 70. Recess 68 is a rectangular recess in fan duct 12 shaped to hold fin core 70. Fin core 70 is a conventional lanced offset fin core formed of a lightweight, thermally conductive material such as aluminum, and diverts normal airflows by 90 degrees, channeling air from gaps 44 toward orifice 50. Fin core 70 abuts thermal pad 46, allowing additional heat transfer between windings 36 and airflow through fin core 70 via thermal pad 46.

By passing fan airflow through gap 44, cooling assembly 10 is able to adequately cool transformer 26 without relying on conductive cool via potting material. Support structure 28 anchors and supports transformer assembly 16 without relying on potting material for structural support. By eschewing potting material in favor of lightweight supports and air cooling, cooling assembly 10 provides significant weight reductions over conventional motor controller transformer assemblies.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A cooling system for a transformer, the cooling system comprising:
    a fan duct containing a fan;
    a housing affixed to the exterior of the fan duct, such that the housing and the fan duct together enclose an interior space;
    a transformer located in the interior space, mounted on the fan duct, and having a plurality of core sections surrounded by windings and separated by gaps;
    an air channeling structure located between the transformer and the fan duct, the air channeling structure comprising an orifice fluidly connecting the gaps between transformer core sections and the interior of the fan duct; and
    a cooling airflow path through the air channeling structure and the gaps between transformer core sections.

2. The cooling system of claim 1, wherein the housing is a motor controller housing.

3. The cooling system of claim 1, wherein the transformer is an autotransformer.

4. The cooling system of claim 1, wherein the fan and fan duct are a part of an air management system of an aircraft.

5. The cooling system of claim 1, further comprising a flat platform formed on an exterior surface of the fan duct covered by the housing.

6. The cooling system of claim 5, wherein the transformer is mounted on the flat platform.

7. The cooling system of claim 6, wherein the transformer is held in place by a support structure comprising brackets affixed to the flat platform.

8. The cooling system of claim 7, wherein each bracket has plurality of fingers, each finger supporting one core of the transformer.

9. The cooling system of claim 8, wherein the air channeling structure further comprises a fin core located between the thermal pad and the fan duct, the fin core diverting air from the gap between transformer core sections toward the orifice, or vice versa, thereby providing an air path between orifice and the gaps between transformer core sections.

10. The cooling system of claim 1, further comprising a thermal pad interposed between the air channeling structure and the transformer.

11. The cooling system of claim 10, wherein the air channeling structure further comprises a series of connected grooves or holes in the thermal pad and the flat platform, the grooves and holes forming airflow channels between the orifice and the gaps between transformer core sections.

12. The cooling system of claim 1, wherein the orifice is an outlet from a high pressure region of the fan duct, downstream of the fan, and air bled by the orifice passes through the air channeling structure, then through the gaps between transformer core sections, then out of the interior space through an air passage in the housing.

13. The cooling system of claim 1, wherein the orifice is an inlet in a low pressure region of the fan duct, upstream of the fan, and air is drawn into the interior space through an air passage in the housing, then through the gaps between transformer core sections, then through the air channeling structure and into the fan.

14. The cooling system of claim 13, further comprising a low pressure volute in the fan duct and a series of holes fluidly connecting the low pressure volute to a region of the interior of the fan duct upstream of the fan, wherein the orifice fluidly connects the low pressure volute to the gaps between transformer core sections.

15. The cooling system of claim 1, further comprising bleed holes in the housing, and wherein the cooling airflow path also extends through the bleed holes to reject air from the housing.

16. The cooling system of claim 1, wherein air flows into the housing from a high pressure region of the fan duct, receives heat from the transformer, and then is ejected into a low pressure region of the fan duct.

17. An air cooling method for a transformer mounted on a fan duct and enclosed within an interior space defined by a housing attached to the fan duct, the transformer having a plurality of core sections surrounded by windings and separated by gaps, and the method comprising:
    providing airflow with a fan in the fan duct;
    directing air through an air channeling structure located between the transformer and the fan duct, the air channeling structure comprising an orifice fluidly connecting the gaps between transformer core sections and the interior of the fan duct; and
    directing air between and around cores sections of the transformer.

18. The method of claim 17, wherein the air channeling structure comprises an outlet in a high pressure region of the fan duct downstream of the fan, and wherein the fan forces air through the outlet, then between and around cores of the transformer, then out of the housing via a bleed hole in the housing.

19. The method of claim 17, wherein the air channeling structure comprises comprises an air inlet in a low pressure region of the fan duct upstream of the fan, and the fan draws air from a high pressure region of the fan duct via an air passage, then between and around cores of the transformer, then through the inlet and into the fan duct.

20. The method of claim 19, wherein the low pressure region of the fan duct is a volute connected to a main flow path of the fan.

* * * * *